(12) United States Patent
Karlicek et al.

(10) Patent No.: US 8,847,561 B2
(45) Date of Patent: Sep. 30, 2014

(54) APPARATUS, SYSTEM, AND METHOD FOR CONTROLLING A MATCHING NETWORK BASED ON INFORMATION CHARACTERIZING A CABLE

(75) Inventors: Tom Karlicek, Fort Collins, CO (US); Gideon J. van Zyl, Fort Collins, CO (US); Lane Sanford, Eaton, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 616 days.

(21) Appl. No.: 12/334,490

(22) Filed: Dec. 14, 2008

(65) Prior Publication Data

US 2009/0278512 A1  Nov. 12, 2009

Related U.S. Application Data

(60) Provisional application No. 61/051,196, filed on May 7, 2008.

(51) Int. Cl.
*G05F 1/59* (2006.01)
*H01J 37/32* (2006.01)
*H03H 7/40* (2006.01)
*H05H 1/46* (2006.01)
*G05F 1/61* (2006.01)

(52) U.S. Cl.
CPC ............ *H05H 1/46* (2013.01); *H01J 37/32174* (2013.01); *H01J 37/32183* (2013.01); *H03H 7/40* (2013.01)
USPC ............................ 323/208; 323/233; 323/285

(58) Field of Classification Search
USPC ................. 323/208, 232–233, 282–284, 285; 438/31
See application file for complete search history.

(56) References Cited

U.S. PATENT DOCUMENTS 5,643,364 A * 7/1997 Zhao et al. ................ 118/723 E
5,982,099 A  11/1999 Barnes et al.
6,384,580 B1 * 5/2002 Ochoa et al. ................. 323/207

(Continued)

FOREIGN PATENT DOCUMENTS

CN  1773848  5/2006
CN  101073085  11/2007

(Continued)

OTHER PUBLICATIONS

Nickitas-Etienne, Athina, "International Preliminary Report on Patentability re Application No. PCT/US09/043134 dated Nov. 18, 2010", , Published in: WO.

(Continued)

*Primary Examiner* — Adolf Berhane
*Assistant Examiner* — Nusrat Quddus
(74) *Attorney, Agent, or Firm* — Neugeboren O'Dowd PC

(57) ABSTRACT

An apparatus, system and method are described that enable an impedance of a plasma load to be matched with a power generator. In some embodiments the apparatus includes a power output adapted to apply power that is utilized to energize a plasma; a sensor adapted to sample power applied at the power output so as to obtain power samples; and an impedance control output configured to provide, responsive to the power samples, an impedance-control signal that enables an impedance matching network connected to the output of the power generator and to the impedance control output to match, responsive to the an impedance-control signal, the impedance of the plasma to the operating impedance of the power generator.

14 Claims, 4 Drawing Sheets

(56) References Cited

U.S. PATENT DOCUMENTS

| | | |
|---|---|---|
| 6,838,832 B1 | 1/2005 | Howald et al. |
| 6,887,339 B1 | 5/2005 | Goodman et al. |
| 2003/0097984 A1 | 5/2003 | Nakano et al. |
| 2005/0001555 A1 | 1/2005 | Parsons et al. |
| 2006/0005928 A1 | 1/2006 | Howald et al. |
| 2006/0116106 A1 | 6/2006 | Turner |
| 2006/0151591 A1 | 7/2006 | Matsuno |
| 2007/0114978 A1* | 5/2007 | Lindahl et al. ............. 323/207 |

FOREIGN PATENT DOCUMENTS

| | | |
|---|---|---|
| JP | 2004207875 | 7/2004 |
| JP | 2006166412 A | 6/2006 |
| JP | 2007035425 | 2/2007 |
| KR | 1020040005809 * | 12/2003 |
| KR | 1020040005809 A | 1/2004 |
| WO | 2007053569 A1 | 5/2007 |
| WO | 2009137669 A2 | 11/2009 |

OTHER PUBLICATIONS

Kim, Jong Hee, "PCT International Search Report re Application No. PCT/US09/043134", Dec. 30, 2009, Published in: PCT.

Baek, Duk Yeul, "Korean Office Action re Application No. 10-2010-7025225", Aug. 8, 2013, p. 3 Published in: KR.

Hayashi, Yasushi, "Japanese Office Action re Application No. 2011-508662", Nov. 18, 2013, p. 7 Published in: JP.

Zhang, Wei, "Chinese Office Action re Application No. 200980120990.X", Apr. 15, 2013, p. 28 Published in: CN.

Wang, June, "Response to Chinese Office Action re Application No. 200980120990.X", Jul. 11, 2013, p. 10 Published in: CN.

SIPO, "Chinese Office Action re Application No. 200980120990.X", Sep. 16, 2013, p. 7 Published in: CN.

Hochstrasser, M., "Supplementary European Search Report re Application No. 09 74 3655 dated", Oct. 24, 2011, Published in: NL.

Zhang, Wei, Chinese Office Action re Application No. 200980120990.X, Sep. 28, 2012, p. 35 Published in: CN.

Gruber, Stephen S., Response to Chinese Office Action re Application No. 200980120990.X, Feb. 8, 2013, pp. 2, Published in: CN.

TIPO, "Taiwan Office Action re Application No. 098115096", Jan. 9, 2014, p. 6 Published in: TW.

Hayashi, Yasushi, "Japanese Office Action re Application No. 2011-508662", Mar. 11, 2014, p. 8 Published in: JP.

The Korean Intellectual Property Office, "Korean Office Action re Application No. 10-2010-7025225", Jan. 24, 2014, pp. 6 Published in: KR.

Yamamoto, Shusaku, "Response to Japanese Office Action re Application No. 2011-508662", May 26, 2014, p. 9, Published in: JP.

* cited by examiner

APPARATUS, SYSTEM, AND METHOD FOR CONTROLLING A MATCHING NETWORK BASED ON INFORMATION CHARACTERIZING A CABLE

PRIORITY

The present application claims priority to U.S. Provisional Application No. 61/051,196, filed May 7, 2008 entitled GENERATOR-CONTROLLED MATCHING NETWORK which is incorporated by reference herein in its entirety.

FIELD OF THE INVENTION

This invention relates generally to apparatus and methods for power delivery systems relating to plasma processing and more particularly to an apparatus and methods for matching the variable impedance of a load.

BACKGROUND OF THE INVENTION

In plasma processing applications, such as the manufacture of semiconductors or flat panel displays, RF power generators apply a voltage to a load in a plasma chamber and may operate over a wide range of frequencies. The impedance of a processing plasma can vary with the frequency of this applied voltage, chamber pressure, gas composition, and the target or substrate material. Consequently, a reactive impedance matching network is typically used to transform the chamber impedance to an ideal load for the power generator (e.g., an RF power generator).

SUMMARY OF THE INVENTION

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

In one embodiment, the invention may be characterized as a power generator for plasma processing. The power generator in this embodiment includes: a power output adapted to apply power that is utilized to energize a plasma; a sensor adapted to sample power applied at the power output so as to obtain power samples; and an impedance control output configured to provide, responsive to the power samples, an impedance-control signal that enables an impedance matching network connected to the output of the power generator and to the impedance control output to match, responsive to the impedance-control signal, the impedance of the plasma to the operating impedance of the power generator.

In another embodiment, the invention may be characterized as a method for delivering power to a plasma load. The method in this embodiment includes generating power at a power generator, wherein the power is utilized to energize a plasma; providing the power to a power output of the power generator, the power output configured to couple the power generator to an impedance matching network; sampling the power so as to obtain power samples, and providing, responsive to the power samples, an impedance control signal to an impedance control output, so as to enable an impedance matching network that is coupled to the impedance control output to be controlled by the signal.

In yet another embodiment, the invention may be characterized as an RF power delivery system for plasma processing. The system in this embodiment may include an RF power generator that includes a power output, a sensor to measure parameters of power delivered by the power output, and an impedance control output configured to provide an output responsive to values of the measured parameters; and an impedance matching network connected to the output of the RF power generator and to the impedance control output of the RF power generator, the impedance matching network configured to provide, responsive to the impedance control output, an efficient transfer of power from the RF power generator to plasma in a plasma processing chamber by matching the impedance of the plasma to the operating impedance of the RF power generator.

As previously stated, the above-described embodiments and implementations are for illustration purposes only. Numerous other embodiments, implementations, and details of the invention are easily recognized by those of skill in the art from the following descriptions and claims.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawings wherein:

DETAILED DESCRIPTION

Figure 1:
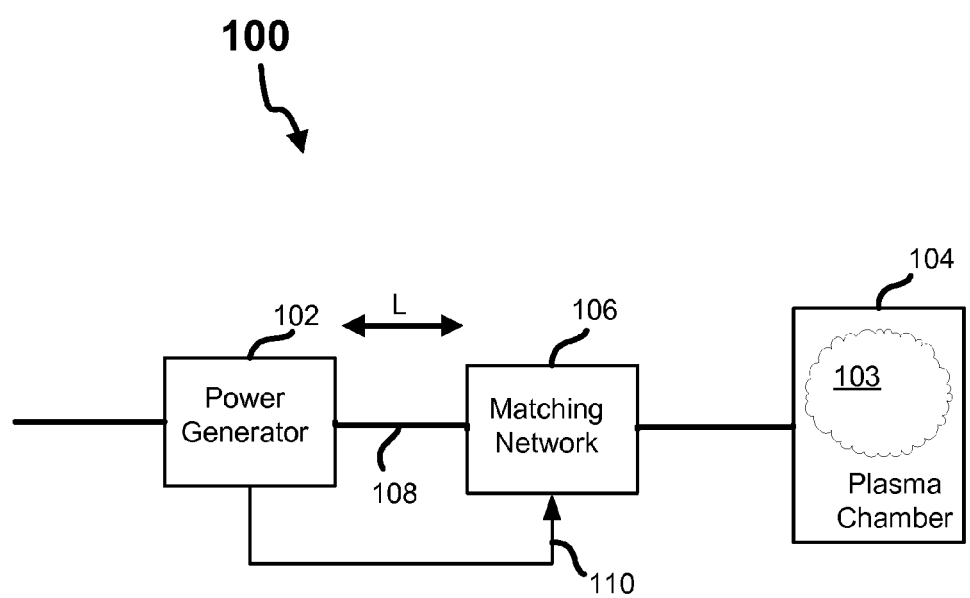
FIG. 1 is a block diagram depicting a plasma processing environment in which several embodiments of the invention are implemented.

Referring now to the drawings, where like or similar elements are designated with identical reference numerals throughout the several views, and referring in particular to FIG. 1, it is a block diagram depicting a plasma processing environment 100 in which several embodiments of the invention are implemented. As shown, a power generator 102 (e.g., a middle or radio frequency (RF) generator) is coupled to a plasma chamber 104 via an impedance matching network 106, and the power generator 102 is coupled to the matching network 106 via both a cable 108 of length L and an impedance-control signal 110.

The power generator 102 generally provides power (e.g., RF power) to the plasma chamber 104 to ignite and sustain a plasma 103 in the chamber 104 for plasma processing. Although not required, in many embodiments the power generator 102 is realized by a collection of two or more generators, and each of the power generators may provide power at a different frequency.

The matching network 106 in this embodiment is generally configured to transform the chamber impedance, which can vary with the frequency of this applied voltage, chamber pressure, gas composition, and the target or substrate material, to a nominal load (e.g., 50 Ohms) for the power generator 102. One of ordinary skill in the art will appreciate that a variety of different matching network techniques (e.g., capacitive and inductive techniques) may be utilized for this purpose.

Unlike typical plasma processing systems, however, the power generator 102 in the exemplary embodiment is configured to provide an impedance-control signal 110 to the matching network 106, which is configured to receive the impedance-control signal 110 (e.g., via serial communication cable), and to utilize the impedance-control signal 110 to match the impedance of the plasma 103 in the chamber 104 to the operating impedance of the power generator 102.

Figure 2:
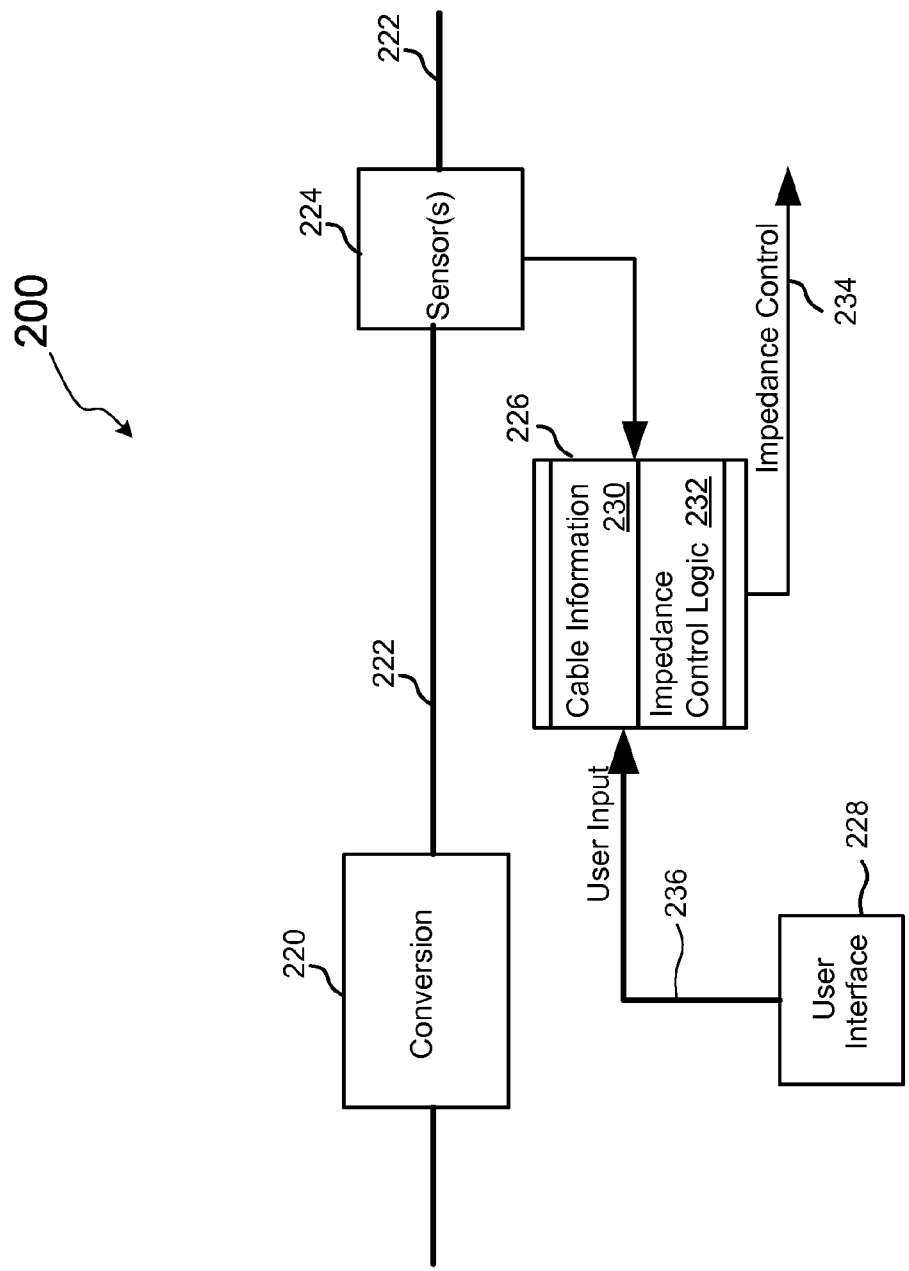
FIG. 2 is a block diagram depicting an exemplary embodiment of the power generator described with reference to FIG. 1.

In many embodiments for example, the power generator 102 includes a measurement system (e.g., sensors and associated sampling and processing components discussed further herein with reference to FIG. 2) that enable the power generator 102 to calculate the impedance at the output of the power generator 102 (e.g., at or in close proximity to where the cable 108 couples with the power generator 102), and generate the impedance-control signal 110 responsive to the calculated impedance.

By way of further example, in some embodiments the power generator obtains information about the cable 108 (e.g., the length L), and using this information about the cable 108, the power generator 102 is able to generate the impedance-control signal 110 so that the impedance transformation of the cable 110 is taken into consideration. In this way, the matching network 110 is able to adjust, responsive to the control signal 110, its impedance so that the impedance at the output of the generator 102 is a nominal impedance for the generator 102 (e.g., 50 Ohms).

As a consequence, the matching network 106 in the exemplary embodiment may be implemented without a measurement system and associated processing that is typically utilized in matching networks; thus eliminating a substantial amount of cost ordinarily incurred when producing a matching network.

Referring next to FIG. 2, shown is a block diagram 200 depicting an exemplary embodiment of the power generator 102 described with reference to FIG. 1. As shown, the power generator 200 in this embodiment includes a conversion portion 220, which includes components that are well known in the art to convert input power (e.g., 480 VAC) to power (e.g., power in the range of frequencies from 400 kHz to 60 MHz) to a power output 222 that may be coupled (e.g., via cable 108) to a matching network (e.g., matching network 106).

Also shown are a sensor 224 that is coupled to an impedance-control portion 226, and a user interface 228 is shown coupled to the impedance-control portion 226 via communication link 236 (e.g., Ethernet). In addition, the impedance control portion 226 includes a memory 230, impedance control logic 232, and an impedance control output 234.

The illustrated arrangement of these components is logical and not meant to be an actual hardware diagram; thus, the components can be combined or further separated in an actual implementation. For example, the functionality of the impedance control logic 232 may be distributed among hardware, software, and firmware components. And one or more of the sensor(s) 224 may be implemented with components that are also utilized in connection with the impedance control logic 232. Moreover, it should be recognized that the components included in FIG. 2 depict an exemplary implementation, and in other embodiments, as discussed further herein, some components may be omitted and/or other components added.

The sensor 224 in this embodiment is generally configured to sample the power that is applied to the output 222 to obtain information that is indicative of the impedance at the output of the generator 200. The sensor(s) 224 may be realized, for example, by a directional coupler (e.g., that provides forward and reflected voltage) or a voltage and current (VI) sensor. But it is contemplated that the sensor 224 may include any four port network that functions like a coupler. As depicted, the impedance-control portion 226, is disposed to receive the sampled information, and responsive to the sampled information provide the impedance control signal 234 to a match network (e.g., match network 106) using a communication link (e.g., a wired or wireless communication link).

In many embodiments, the impedance control logic 232 utilizes the power samples from the sensor(s) 224 to determine the impedance of the load at the output 222 of the generator, and the cable information stored in memory 230 is used to compensate for the impedance transformation of the cable (e.g., cable 108) so that the impedance at the match network may be calculated. In this way, the impedance control signal 234 may be generated in response to both, the power samples and the cable information so that the impedance control signal 234 may be used by the match network to control the impedance at the match network.

As discussed herein, "sample" means obtaining information relative to that which is being sampled, and "sampling" need not mean taking distinct samples in time (e.g., as is commonly carried out in the context of digital signal processing). In other words, a "sampled" signal or quantity as discussed herein may be continuous in time and value.

In some variations of the embodiment depicted in FIG. 2, a user may enter cable information (e.g., cable length L) via the user interface 228 and the cable information entered by the user is stored in memory 230. In other variations, the impedance control logic 232 may include logic to determine cable information using information received by the sensor(s) 224, and the memory 230 may be used to store the calculated cable information (e.g., cable length L). In addition to the cable length, the cable loss may also be stored and used to make more accurate calculations.

In some embodiments, the impedance control logic 232 automatically determines the length of the cable between the generator 200 and the match network. By way of example, it is often possible to set the variable elements in the matching network in such a way that the reflection coefficient with respect to 50 ohm of the impedance at the generator side of the matching network has a magnitude close to 1 and is a very weak function of the plasma impedance so that the impedance at the generator side of the match is known when the variable elements are set in this way.

The impedance presented to the impedance matching network by the plasma can be further controlled by applying so little power that the plasma remains un-ignited. With the impedance at the generator side of the impedance matching network known, the length of the cable is easily determined from this known impedance and the impedance measured at the generator. It is also possible to use more than one setting of the variable elements in the impedance matching network to obtain better estimates of the cable length.

Specifically, if so little power is applied that the plasma remains unlit, the plasma impedance can be assumed to remain the same between three different settings of the variable elements and the measured impedance at the generator with three settings with constant plasma impedance allows for the determination of the cable length. Variable frequency can also be used to estimate the cable length provided that the impedance at the generator side of the impedance matching network is known over frequency or it can be combined with more than one setting of the variable components in the impedance matching network.

Figure 3:
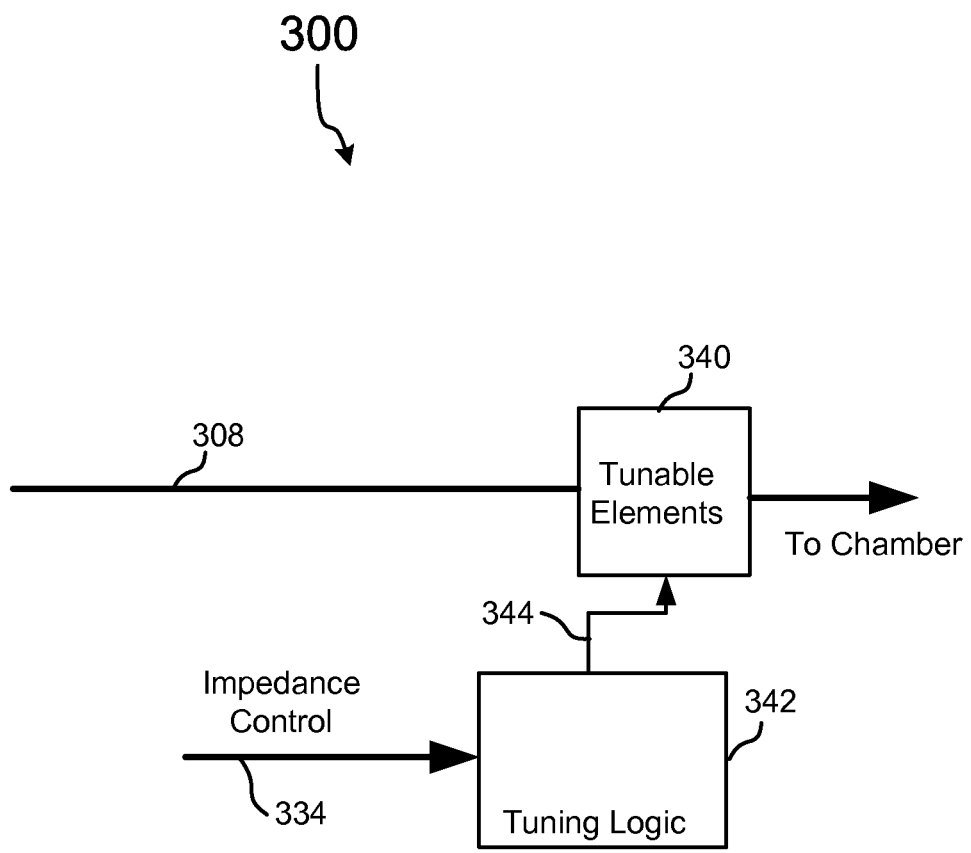
FIG. 3 is a block diagram depicting an exemplary embodiment of the match network described with reference to FIG. 1.

Referring next to FIG. 3, it is a block diagram depicting an exemplary embodiment of the match network 106 described with reference to FIG. 1. As shown, the match network 300 in this embodiment includes tunable elements 340 that are coupled to a cable 308 that is coupled to a power generator (e.g., generator 102, 200) and tuning logic 342. As depicted, the tuning logic 342 is also adapted to receive an impedance control signal 334 (e.g., from generator 102, 200).

And responsive to receiving the impedance control signal 334, the tuning logic 342 in this embodiment is adapted to generate a tuning signal 344 to adjust the tunable elements 340. In some embodiments, for example, the tuning logic 342 may include logic to convert the impedance control signal 334 from one communication protocol (e.g., a serial bus protocol) and if necessary further convert the impedance control signal 334 to accommodate for any differences between the content of the impedance control signal 334 and the type of signal that the tunable elements 340 respond to. As one of ordinary skill in the art will appreciate, the illustrated arrangement of these components is logical and not meant to be an actual hardware diagram; thus, the components can be combined or further separated in an actual implementation. For example, the functionality of the tuning logic 342 may be distributed among hardware, software, and firmware components.

The tuning elements 340 in this embodiment may, as is well known ion the art, include capacitive and inductive elements that are adjustable. In this embodiment, the tunable elements are adjusted responsive to the tuning signal 344 from the tuning logic 342 so as to alter an impedance of the load seen by the generator.

As shown, the matching network 300 in this embodiment does not include a measurement system, nor any processing components that are necessary for a measurement system, to measure the impedance for purposes of adjusting the tuning elements 340. As a consequence, the complexity and the cost of the matching network in this embodiment are substantially reduced.

Figure 4:
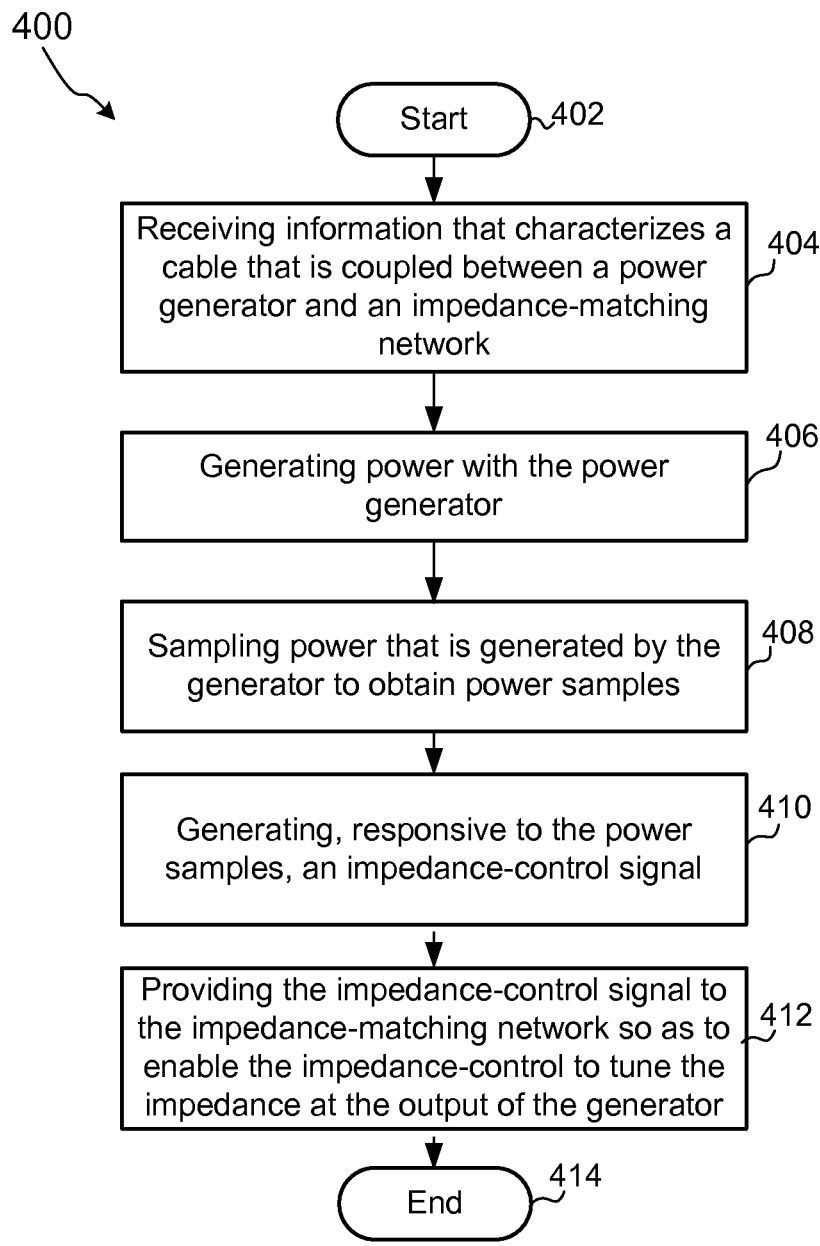
FIG. 4 is a flowchart that depicts an exemplary method for matching an impedance of a plasma load to a power generator.

Referring next to FIG. 4, shown is a flow cart 400 depicting a method for matching an impedance of a plasma load to a power generator. Although reference is made to the embodiments depicted in FIGS. 1, 2, and 3 for purposes of example, it should be recognized that the method depicted in FIG. 4 is certainly not limited to those specific embodiments.

As shown in FIG. 4, initially information that characterizes a cable that is coupled between a power generator and an impedance-matching network is received. In many embodiments for example, the information includes a length of the cable (e.g., cable 108, 308) that couples a generator (e.g., generator 102, 200) to a matched network (e.g., matched network 106, 300). And in some variations of these embodiments, the information is entered by a user (e.g., via user interface 228), and in other variations, the generator is capable of determining useful cable information. As shown, the cable information may be stored for reference in a memory (e.g., memory 230) of the generator for future reference (Blocks 402, 404).

As depicted, power that is generated by the generator is sampled (e.g., at an output 222 of the generator) to obtain power samples (Blocks 406, 408), and responsive to the power samples, an impedance control signal (e.g., impedance control signal 110, 234, 334) is generated (Blocks 410). The impedance control signal is then provided to the matching network (e.g., via serial cable) so as to enable the matching network to tune the impedance (e.g., to a preferred impedance for the generator) (Blocks 412, 414).

In conclusion, the present invention provides, among other things, an apparatus, system and method for matching the variable impedance of a plasma load to a power generator. Those skilled in the art can readily recognize that numerous variations and substitutions may be made in the invention, its use and its configuration to achieve substantially the same results as achieved by the embodiments described herein. Accordingly, there is no intention to limit the invention to the disclosed exemplary forms. Many variations, modifications and alternative constructions fall within the scope and spirit of the disclosed invention as expressed in the claims.

What is claimed is:

1. A power generator for plasma processing comprising:
    a power output adapted to apply power that is utilized to energize a plasma via a cable;
    a sensor adapted to sample power applied at the power output so as to obtain power samples; and
    an impedance control output configured to provide, responsive to the power samples and information characterizing the cable, an impedance-control signal that enables an impedance matching network connected to the output of the power generator and to the impedance control output to match, responsive to the impedance-control signal, the impedance of the plasma to the operating impedance of the power generator; wherein
    the information characterizing the cable comprises a length of the cable; and
    the power generator is configured to automatically determine the length of the cable between the power generator and the match network based on impedance measured at the power generator and an impedance measured at the power generator while applying power such that the plasma remains unignited.

2. The power generator of claim 1, including:
    a memory configured to store the information characterizing the cable that couples the power generator to the impedance matching network, and wherein the power generator is configured to provide the impedance control signal responsive to the information characterizing the cable.

3. The power generator of claim 2, including:
    a user interface configured to enable a user to input at least a portion of the information that characterizes the cable.

4. The power generator of claim 3, including an impedance-control-logic portion configured to generate the content of the impedance-control signal responsive to the length of the cable and the power samples.

5. The power generator of claim 1, wherein the sensor includes a sensor selected from the group consisting of a voltage-current sensor and a directional coupler.

6. The power generator of claim 1, wherein the power output is adapted to apply RF power.

7. A method for delivering power to a plasma load comprising:
    generating power at a power generator, wherein the power is utilized to energize a plasma;
    providing the power to a power output of the power generator, the power output configured to couple the power generator to an impedance matching network via a cable;
    sampling the power at the power output so as to obtain power samples, and
    providing, responsive to the power samples and information characterizing the cable, the information characterizing the cable comprising a length of the cable, an impedance control signal to an impedance control output, so as to enable an impedance matching network that is coupled to the impedance control output to be controlled by the signal; and
    determining, based on the power samples and an impedance measured at the power generator while applying power such that the plasma remains unignited, the length of the cable between the power generator and the match network.

8. The method of claim 7, including:
storing, in a memory of the power generator, the information characterizing the cable that couples the power generator to the impedance matching network, and wherein the power generator is configured to provide the impedance control signal responsive to the information characterizing the cable.

9. The method of claim 8, including:
receiving at least a portion of the information that characterizes the cable from a user via a user interface.

10. The method of claim 8, including:
generating the content of the impedance-control signal responsive to the length of the cable and the power samples.

11. The method of claim 7, wherein the power samples include information indicative of forward and reverse voltage information.

12. A power delivery system for plasma processing comprising:
a power generator including:
a power output configured to provide power via a cable,
a sensor to measure parameters of power delivered by the power output and information characterizing the cable, the information characterizing the cable including a length of the cable,
logic configured to calculate the length of the cable based on the parameters of power and an impedance measured at the power generator while applying power such that the plasma remains unignited, and
an impedance control output configured to provide an impedance control signal responsive to values of the parameters measured by the sensor; and
an impedance matching network connected to the output of the power generator and to the impedance control output of the power generator, the impedance matching network configured to provide, responsive to the impedance control signal, an efficient transfer of power from the power generator to plasma in a plasma processing chamber by matching the impedance of the plasma to the operating impedance of the power generator.

13. The system of claim 12, wherein the power generator includes a memory configured to store the information characterizing the cable that couples the power generator to the impedance matching network, and wherein the power generator is configured to provide the impedance control signal responsive to the information characterizing the cable.

14. The system of claim 13, wherein the power generator includes a user interface configured to enable a user to input at least a portion of the information characterizing the cable.

* * * * *